United States Patent
Joung et al.

(10) Patent No.: US 11,956,993 B2
(45) Date of Patent: Apr. 9, 2024

(54) ORGANIC LIGHT EMITTING DISPLAY DEVICE AND METHOD FOR MANUFACTURING THE SAME

(71) Applicant: LG DISPLAY CO., LTD., Seoul (KR)

(72) Inventors: SeungRyong Joung, Gimpo-si (KR); KangJu Lee, Goyang-si (KR); Hansun Park, Paju-si (KR); Seongsu Jeon, Gwangmyeong-si (KR); Wonhoe Koo, Goyang-si (KR)

(73) Assignee: LG Display Co., Ltd., Seoul (KR)

( * ) Notice: Subject to any disclaimer, the term of this patent is extended or adjusted under 35 U.S.C. 154(b) by 424 days.

(21) Appl. No.: 17/398,154

(22) Filed: Aug. 10, 2021

(65) Prior Publication Data

US 2021/0367213 A1 Nov. 25, 2021

Related U.S. Application Data

(62) Division of application No. 16/424,613, filed on May 29, 2019, now Pat. No. 11,114,643, which is a
(Continued)

(30) Foreign Application Priority Data

Nov. 30, 2015 (KR) ........................ 10-2015-0168747

(51) Int. Cl.
*H10K 50/858* (2023.01)
*H10K 50/11* (2023.01)
(Continued)

(52) U.S. Cl.
CPC ........... *H10K 50/858* (2023.02); *H10K 50/11* (2023.02); *H10K 50/81* (2023.02); *H10K 50/82* (2023.02);
(Continued)

(58) Field of Classification Search
CPC ...... H10K 50/858; H10K 50/11; H10K 50/81; H10K 50/82; H10K 50/822; H10K 50/856;
(Continued)

(56) References Cited

U.S. PATENT DOCUMENTS

2005/0106776 A1 5/2005 Yotsuya
2005/0285509 A1* 12/2005 Funamoto ............ H10K 50/858
313/504

(Continued)

FOREIGN PATENT DOCUMENTS

DE 10-2016-117918 A1 3/2017
JP 2005276803 A 10/2005
(Continued)

*Primary Examiner* — Mohammad A Rahman
(74) *Attorney, Agent, or Firm* — Fenwick & West LLP

(57) ABSTRACT

An organic light emitting display device and a method for manufacturing the same are disclosed. The organic light emitting display device includes a substrate divided into an emission area and a non-emission area, an overcoat layer disposed on the substrate and including a plurality of micro lenses in the emission area, a first electrode disposed on the overcoat layer and disposed in the emission area, an organic emission layer disposed on the substrate and having at least one layer which is flatly formed in the emission area, and a second electrode disposed on the organic emission layer.

11 Claims, 9 Drawing Sheets

Related U.S. Application Data division of application No. 15/352,187, filed on Nov. 15, 2016, now Pat. No. 10,347,871.

(51) Int. Cl.
| | |
|---|---|
| *H10K 50/81* | (2023.01) |
| *H10K 50/813* | (2023.01) |
| *H10K 50/82* | (2023.01) |
| *H10K 50/822* | (2023.01) |
| *H10K 50/854* | (2023.01) |
| *H10K 50/856* | (2023.01) |
| *H10K 59/124* | (2023.01) |
| *H10K 59/38* | (2023.01) |
| *H10K 71/00* | (2023.01) |
| *H10K 71/13* | (2023.01) |
| *H10K 102/00* | (2023.01) |

(52) U.S. Cl.
CPC ......... *H10K 50/822* (2023.02); *H10K 50/856* (2023.02); *H10K 59/124* (2023.02); *H10K 59/38* (2023.02); *H10K 71/00* (2023.02); *H10K 71/135* (2023.02); *H10K 50/813* (2023.02); *H10K 50/854* (2023.02); *H10K 2102/351* (2023.02)

(58) Field of Classification Search
CPC ...... H10K 59/124; H10K 59/38; H10K 71/00; H10K 71/135; H10K 50/813; H10K 50/854; H10K 2102/351; H10K 59/12; H10K 59/1201; H10K 10/10; H10K 19/00; H10K 30/00; H10K 39/00; H10K 50/00; H10K 59/00; H10K 65/00; H10K 77/00; H10K 85/00; H10K 99/10; H10K 2101/00; H10K 2102/00

See application file for complete search history.

(56) References Cited

U.S. PATENT DOCUMENTS

| | | |
|---|---|---|
| 2008/0024402 A1 | 1/2008 | Nishikawa et al. |
| 2008/0122347 A1 | 5/2008 | Lee |
| 2010/0142185 A1 | 6/2010 | Wako et al. |
| 2010/0265223 A1 | 10/2010 | Asaki et al. |
| 2014/0138642 A1 | 5/2014 | Kim |
| 2014/0151651 A1 | 6/2014 | Jin ...................... H01L 27/3248 257/40 |
| 2014/0346449 A1* | 11/2014 | Choi ................... H10K 50/854 438/23 |
| 2015/0179978 A1 | 6/2015 | Sato |
| 2015/0263235 A1 | 9/2015 | Shin et al. |
| 2015/0380466 A1 | 12/2015 | Koo et al. |
| 2016/0141528 A1 | 5/2016 | Masuyama et al. |
| 2017/0084669 A1* | 3/2017 | Wolk .................. H10K 50/858 |
| 2017/0084676 A1 | 3/2017 | Jang et al. |
| 2017/0243930 A1* | 8/2017 | Kondo .................. H10K 71/00 |

FOREIGN PATENT DOCUMENTS

| | | |
|---|---|---|
| JP | 2006-022183 A | 1/2006 |
| JP | 2006221839 A | 8/2006 |
| JP | 2015122248 A | 7/2015 |
| KR | 10-2014-0080235 A | 6/2014 |
| KR | 1020140115840 A | 10/2014 |
| KR | 1020150077279 A | 7/2015 |
| TW | I259026 B | 7/2006 |
| TW | 201513422 A | 4/2015 |
| WO | 2005107327 A1 | 11/2005 |
| WO | 2014/050344 A1 | 4/2014 |

\* cited by examiner

ORGANIC LIGHT EMITTING DISPLAY DEVICE AND METHOD FOR MANUFACTURING THE SAME

CROSS-REFERENCE TO RELATED APPLICATIONS

This application is a Divisional of U.S. patent application Ser. No. 16/424,613, filed on May 29, 2019, now allowed, which is a Divisional of U.S. patent application Ser. No. 15/352,187, filed on Nov. 15, 2016, now U.S. Pat. No. 10,347,871, which claims priority from Korean Patent Application No. 10-2015-0168747, filed on Nov. 30, 2015, which is hereby incorporated by reference for all purposes as if fully set forth herein.

BACKGROUND

Field of the Invention

The present disclosure relates to an organic light emitting display device and a method for manufacturing the same, and more particularly, to an organic light emitting display device with improved light extraction efficiency and a method for manufacturing the same.

Description of the Related Art

In general, an organic light emitting display device as a self-light emitting display device does not require a separated light source, which is different from a liquid crystal display device, and can be thin and light. Further, the organic light emitting display device is driven with low voltage and low power consumption, and is excellent even in color expression, response speed, viewing angle, and contrast ratio (CR), and thus the organic light emitting display device has been researched as a next-generation display.

The light emitted from an organic emission layer of the organic light emitting display device passes through various constituent elements of the organic light emitting display device to be emitted to the outside of the organic light emitting display device. However, some of the light emitted from the organic emission layer is not emitted out of the organic light emitting display device but trapped in the organic light emitting display device; thus, there is a problem in light extraction efficiency of the organic light emitting display device.

For example, a total reflection or a light absorption occurs at an anode electrode in the organic light emitting display device having a bottom emission structure, and thus, a ratio of the light trapped in the organic light emitting display device by the anode electrode is approximately 50% of the light emitted from the organic emission layer. Such a total reflection or a light absorption also occurs on the substrate, and thus, a ratio of the light trapped in the organic light emitting display device by the substrate is approximately 30% of the light emitted from the organic emission layer.

As a result, approximately 80% of the light emitted from the organic emission layer may be trapped in the organic light emitting display device and only approximately 20% of the light may be extracted to the outside, thereby lowering the light efficiency of the organic light emitting display device. In order to improve the light extraction efficiency of the organic light emitting display device, a method of forming a micro lens array (MLA) on an overcoat layer of an organic light emitting display device has been proposed.

Meanwhile, the thickness of the organic emission layer disposed on an inclined surface of a micro lens of the MLA is formed to be smaller, and thus, primary light emission is generated on the inclined surface, as a stronger electric field is applied to the organic emission layer having the smaller thickness. In addition, the light extraction efficiency in a front direction is typically highest in a top region of the micro lens, and the light extraction efficiency decreases toward the bottom of the micro lens. However, the thickness of the organic emission layer is greater in the region of the highest light extraction efficiency, and thus, an amount of current flowing in the top region of the micro lens is low. In other words, the region having the highest light extraction efficiency has a lower light emission efficiency.

Accordingly, a method of improving the light emission efficiency of an organic emission layer in a top region of a micro lens would be beneficial.

SUMMARY

Accordingly, the present disclosure is directed to provide an organic light emitting diode display device and a method for manufacturing the same that substantially obviate one or more problems due to limitations and disadvantages of the related art.

An advantage of the present disclosure is to provide an organic light emitting diode display device with enhanced light extraction efficiency.

Additional advantages and features of the present disclosure will be set forth in part in the description which follows and in part will become apparent to those having ordinary skill in the art upon examination of the following or may be learned from practice of the invention. The objectives and other advantages of the present disclosure may be realized and attained by the structure particularly pointed out in the written description and claims hereof as well as the appended drawings.

According to one aspect of the present disclosure, an organic light emitting display device is provided. The organic light emitting display device includes a substrate, an overcoat layer, a first electrode, an organic stacking layer, and a second electrode. The substrate is divided into an emission area and a non-emission area. The overcoat layer is disposed on the substrate and includes a plurality of micro lenses in the emission area, and each of the plurality of micro lens includes a convex region. The first electrode is disposed on the overcoat layer and disposed in the emission area. The organic stacking layer is disposed on the first electrode. The organic stacking layer includes an organic emission layer, and at least one surface of the organic stacking layer is a flat surface in the emission area. The second electrode is disposed on the organic emission layer in the emission area and the non-emission area.

According to another aspect of the present disclosure, an organic light emitting display device is provided. The organic light emitting display device includes a substrate, an overcoat layer, a first electrode, an organic stacking layer, and a second electrode. The substrate is divided into an emission area and a non-emission area. The overcoat layer is disposed on the substrate and includes a plurality of micro lenses in the emission area, and each of the plurality of micro lens includes a convex region. The first electrode is disposed on the overcoat layer and disposed in the emission area. The organic stacking layer is disposed on the first electrode. The organic stacking layer includes an organic emission layer, and a thickness of the organic stacking layer in a direction normal to a surface of the substrate, on which the overcoat layer is disposed, is smallest in a region corresponding to the convex region of each of the plurality of micro lenses. The second electrode is disposed on the organic emission layer in the emission area and the non-emission area.

The micro lens may be divided into a first region to a fourth region. The first region may correspond to a concave region of the micro lens. The second region may correspond to a first inclined surface of the micro lens, and the first inclined surface may be extended from the concave region. The third region may correspond to a second inclined surface extended from the first inclined surface. The fourth region may correspond to the convex region of the micro lens.

An absolute value of a slope of the first incline surface may be smaller than an absolute value of a slope of the second incline surface.

A morphology of the first electrode may be corresponding to the morphology of the plurality of micro lenses in the emission area.

The first electrode may comprise a convex portion and a connection portion.

The organic stacking layer may be divided into a lower organic stacking layer disposed on the first electrode and an upper organic staking layer disposed on the lower organic stacking layer, and the upper organic stacking layer may include the emission layer. The flat surface may be one surface of the lower organic stacking layer in the emission area.

Each of the plurality of micro lens may further include a concave region connected to the convex region, and the lower organic stacking layer may be disposed at a concave region of the micro lens.

The lower organic stacking layer may cover the convex portion of the first electrode.

A surface of the upper organic stacking layer away from the first electrode may be a flat surface in the emission area.

The second electrode may be flatly formed in the emission area.

In the emission area, the upper organic stacking layer may include at least one depressed portion corresponding to the connection portion of the first electrode.

In the emission area, the second electrode may include at least one depressed portion and at least one projected portion.

The organic light emitting display device may further include a reflective layer disposed between the organic emission layer and the first electrode in the emission area, wherein the reflective layer may be disposed only in the first to third regions or the first and second regions of the micro lens.

A color filter layer may be further disposed between the substrate and the overcoat layer in the emission area.

A thickness in a vertical direction of the organic stacking layer may be smallest in a region corresponding to the convex region of the micro lens.

According to still another aspect of the present disclosure, a method for manufacturing an organic light emitting display device includes the following steps. Form an overcoat layer with a plurality of micro lenses in an emission area on a substrate divided into the emission area and a non-emission area. Form a first electrode on the overcoat layer in the emission area. Form an organic stacking layer by a liquid organic material. The organic stacking layer is disposed on the first electrode in the emission area. The organic stacking layer includes an organic emission layer. At least one surface of the organic stacking layer is a flat surface in the emission area. Form a second electrode on the organic stacking layer in the emission area and the non-emission area.

According to the other aspect of the present disclosure, a method for manufacturing an organic light emitting display device includes the following steps. Form an overcoat layer with a plurality of micro lenses in an emission area on a substrate divided into the emission area and a non-emission area, and each of the plurality of micro lens including a convex region. Form a first electrode on the overcoat layer in the emission area. Form an organic stacking layer on the first electrode in the emission area. The organic stacking layer includes an organic emission layer. A thickness of the organic stacking layer in a direction normal to a surface of the substrate, on which the overcoat layer is disposed, is smallest in a region corresponding to the convex region of each of the plurality of micro lenses. Form a second electrode on the organic stacking layer in the emission area and the non-emission area.

The organic stacking layer may be divided into a lower organic stacking layer disposed on the first electrode and an upper organic stacking layer disposed on the lower organic stacking layer. The organic emission layer may be in upper organic stacking layer, and the lower organic stacking layer or the upper organic stacking layer may be formed by an inkjet printing method or a nozzle printing method.

Each of the plurality of micro lens may include a convex region. A thickness in a vertical direction of the organic stacking layer may be the smallest in a region corresponding to the convex region of each of the plurality of micro lenses.

The organic stacking layer is formed by a liquid organic material, and at least one surface of the organic stacking layer is a flat surface in the emission area As for the organic light emitting display device and method thereof according to exemplary embodiments of the present disclosure, in a fourth region having the highest light extraction efficiency among regions of the micro lens, and an electric field is concentrated in the organic emission layer to generate primary light emission; thus, the light emission efficiency of the organic light emitting display device applied with the micro lens can be improved.

It is to be understood that both the foregoing general description and the following detailed description of the present disclosure are exemplary and explanatory and are intended to provide further explanation of the invention as claimed.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE ILLUSTRATED EMBODIMENTS

Figure 1:
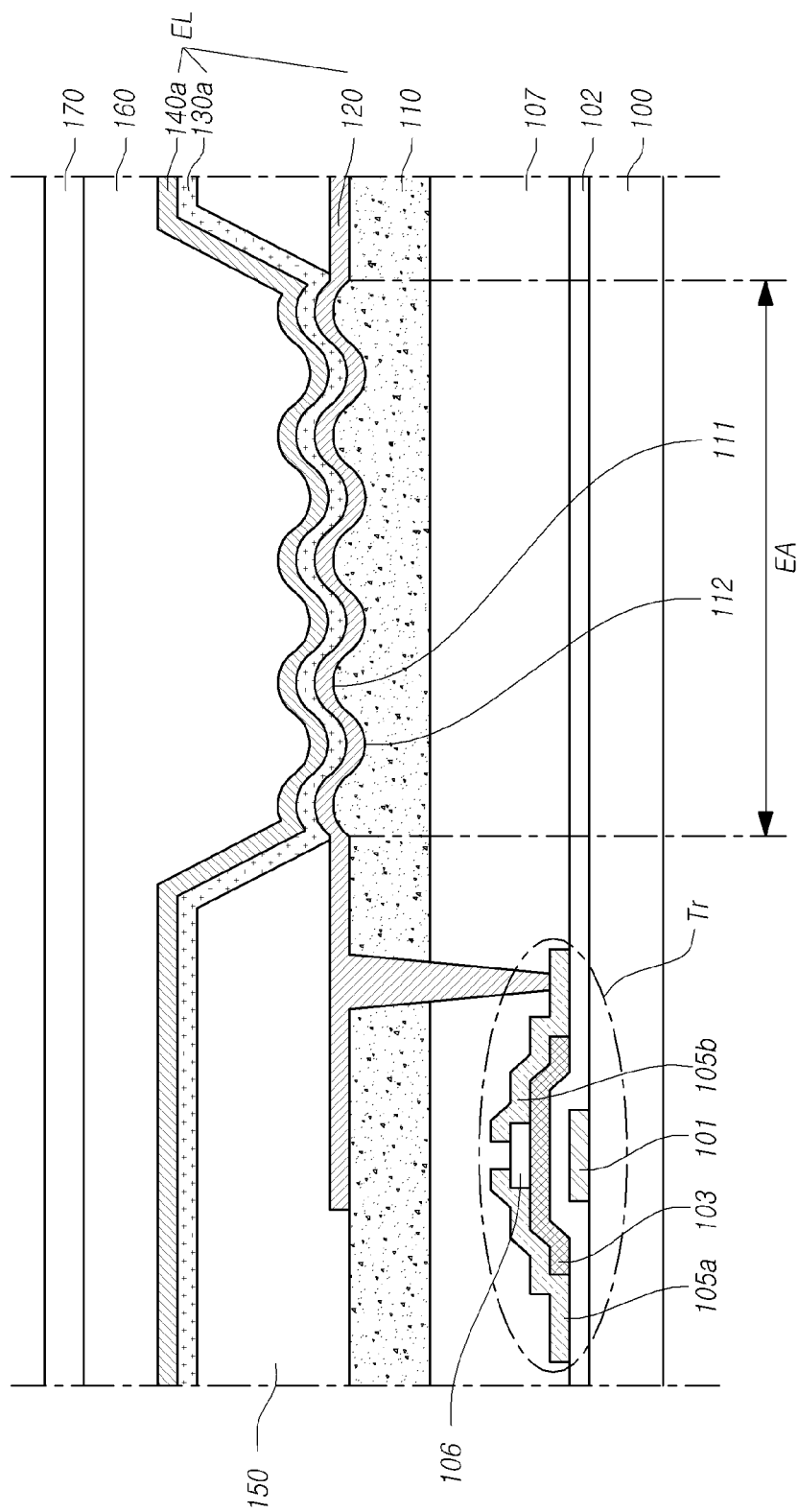
FIG. 1 is a cross-sectional view of an organic light emitting display device to which embodiments of the present disclosure may be applied.

Hereinafter, exemplary embodiments of the present disclosure will be described with reference to the accompanying drawings. The following drawings are provided as examples so that this disclosure will fully convey the scope of the present disclosure to those skilled in the art. As those skilled in the art would realize, the described embodiments may be modified in various different ways, all without departing from the spirit or scope of the present disclosure. In addition, in the drawings, the size and the thickness of an apparatus may be exaggerated and expressed for easy description. Like reference numerals designate like elements throughout the specification.

Various advantages and features of the present disclosure and methods accomplishing thereof will become apparent from the following description of exemplary embodiments with reference to the accompanying drawings. However, the present disclosure is not limited to the following embodiments but may be implemented in various different forms. The embodiments are provided only to complete disclosure of the present disclosure and to fully provide a person having ordinary skill in the art to which the present disclosure pertains with the category of the disclosure, and the present disclosure will be defined by the appended claims. Throughout the whole specification, the same reference numerals denote the same elements. The size and relative size of the constituent elements marked in the drawings may be exaggerated for clarity of description.

When an element or a layer is referred to as being "on" another element or layer, it may be directly on the other element or layer, or intervening elements or layers may be present. On the contrary, designating that the elements are "directly on" or "just above" represents the case where other elements or layers are not interposed therebetween.

Below", "beneath", "lower", "above", "upper", and the like which are spatially relative terms may be used to easily describe correlation between one element or component and other elements or components as illustrated in the drawings. The spatially relative terms should be appreciated as terms including different directions of the element in use or operation in addition to directions illustrated in the drawings. For example, when an element illustrated in the drawings is turned over, an element described to be "below" or "beneath" other elements may be laid "above" other elements. Accordingly, "below" which is an exemplary term may include both upper and lower directions.

Further, terms such as first, second, A, B, (a), (b), and the like may be used in describing the components of the exemplary embodiments according to the present disclosure. The terms are used to just distinguish the component from other components and the essence, sequence, or order of the corresponding component is not limited by the terms.

FIG. 1 is a cross-sectional view of an organic light emitting display device according to an embodiment of the present disclosure.

Referring to FIG. 1, the organic light emitting display device includes a thin film transistor Tr and an organic emission element EL electrically connected with the thin film transistor Tr. Particularly, a gate electrode 101 and a gate insulating layer 102 of the thin film transistor Tr are disposed on a first substrate 100. An active layer 103 overlapped with the gate electrode 102 is disposed on the gate insulating layer 102. An etch stop layer 106 for protecting a channel region of the active layer 103 is disposed on the active layer 103.

In addition, a source electrode 105a and a drain electrode 105b which contact the active layer 103 are disposed on the active layer 103. A protective layer 107 is disposed on the source electrode 105a and the drain electrode 105b. The embodiment is not limited to the structure disclosed in FIG. 1. An organic light emitting display device according other embodiments of the present disclosure may further include a buffer layer which is disposed between the first substrate 100 and the active layer 103.

Further, an overcoat layer 110 is disposed on the protective layer 107. Meanwhile, a surface plasmon effect occurs at an interface between a metal layer and an organic emission layer to guide light, and the organic emission layer between reflective layers may occupy an area corresponding to approximately 60 to 70% of a total emitted light. In other words, some of the light emitted from an organic emission layer 130a is not emitted to the outside but trapped inside the display device.

In order to extract the light trapped inside the display device, the overcoat layer 110 includes a plurality of convex portions 111 and a plurality of connection portions 112 connecting adjacent convex portions 111. The plurality of convex portions 111 may have a hemispherical or semi-ellipsoidal shape, but the embodiment is not limited thereto.

The plurality of convex portions 111 and the plurality of connection portions 112 connecting adjacent convex portions 111 may be disposed at a position corresponding to an emission area of each sub-pixel. Herein, the emission area means an area in which the organic emission layer 130a emits light by a first electrode 120 and a second electrode 140. In other words, the emission area is an area in which the light generated by the organic emission layer 130a is emitted.

The plurality of convex portions 111 and the plurality of connection portions 112 connecting adjacent convex portions 111 are arranged in an emission area of each sub-pixel to further extract the light emitted from the organic emission element EL to the outside of the display device.

The first electrode 120 of the organic emission element EL, which is connected with the drain electrode 105b of the thin film transistor Tr, is disposed on the overcoat layer 110. The first electrode 120 may be made of a transparent conductive material, but the embodiment is not limited thereto.

In addition, a bank pattern 150 is disposed on the overcoat layer 110 to expose a part of the upper surface of the first electrode 120. The organic emission layer 130a is disposed on the upper surface of the first electrode 120 exposed by an opening of the bank pattern 150.

Herein, the organic emission layer 130a may be disposed only on the upper surface of the first electrode 120 exposed by the opening of the bank pattern 150 or disposed on the first electrode 120 and the top of the bank pattern 150. In addition, the second electrode 140 of the organic emission element EL is disposed on the organic emission layer 130a and the bank pattern 150. Herein, the second electrode 140 may be made of a reflective material, but the embodiment is not limited thereto.

Further, an encapsulation layer 160 for protecting the organic emission element EL from moisture and oxygen is disposed on the second electrode 140. In FIG. 1, the encapsulation layer 160 illustrates a configuration of a single layer, but the embodiment is not limited thereto. For example, the encapsulation layer 160 may be formed in a multi-layered structure. A second substrate 170 may be disposed on the encapsulation layer 160.

Further, FIG. 1 illustrates a bottom-emission type organic light emitting display device, but the embodiment is not limited thereto. For example, a top-emission or dual-emission type organic light emitting display device can also be used.

For a bottom-emission type organic light emitting display device, a color filter layer may be disposed on the protective layer 107. In this case, the color filter layer is disposed in each of a plurality of sub-pixels or may be disposed only in some of the plurality of sub-pixels. The color filter layer may be disposed at a position corresponding to the emission area of each sub-pixel. Herein, forming of the color filter layer at the position corresponding to the emission area means that the color filter layer is disposed to reduce or prevent a blurring and a ghosting generated by a mixing of light emitted from adjacent emission areas.

In order to improve light extraction efficiency, the overcoat layer 110 may be formed with a plurality of micro lenses constituted by the convex portions 111 and the connection portions 112 connecting the adjacent convex portions 111.

With respect to light incident on an interface between the micro lens and the first electrode 120, the light incident at an angle smaller than a total reflection threshold angle is extracted out of the first substrate 100 through the first electrode 120. In addition, the light incident at an angle equal to or greater than the total reflection threshold angle is not blocked in the organic emission element EL, but reflected by the second electrode 140 and directed toward the first electrode 120 again. An incident angle of the light reflected is smaller than the total reflection threshold angle, and thus the light is extracted out of the first electrode 120.

Meanwhile, the pixel in the embodiment includes one or more sub-pixels, but the embodiment is not limited thereto. For example, one pixel may include two to four sub-pixels.

The sub-pixel means a unit in which a specific color of a color filter layer is formed or when a color filter layer is not formed, an organic emission element may emit light having a specific color. The specific colors defined in the sub-pixel may include red R, green G, blue B, and selectively white W, but the embodiment is not limited thereto.

Also, an electrode which is connected to the thin film transistor controlling light emission in each sub-pixel area of a display panel is referred to as the first electrode, and an electrode disposed on an entire surface of the display panel or including two or more pixel areas is referred to as the second electrode. When the first electrode is an anode electrode, the second electrode is the cathode electrode, and vice versa. Hereinafter, the anode electrode as an embodiment of the first electrode and the cathode electrode as an embodiment of the second electrode will be mainly described, but the embodiments are not limited thereto.

Further, the aforementioned sub-pixel may or may not include a color filter layer of a single color. In addition, a light-scattering layer may be disposed in order to improve light extraction efficiency of the organic emission layer in each sub-pixel area. The aforementioned light-scattering layer may be referred to as a micro lens array, a nano pattern, a diffuse pattern, and a silica bead. Hereinafter, a micro lens array will be mainly described as embodiments of a light-scattering layer, but the embodiments are not limited thereto, and various structures can be employed for scattering light.

Organic light emitting display devices according to embodiments of the present disclosure will now be described.

Figure 2:
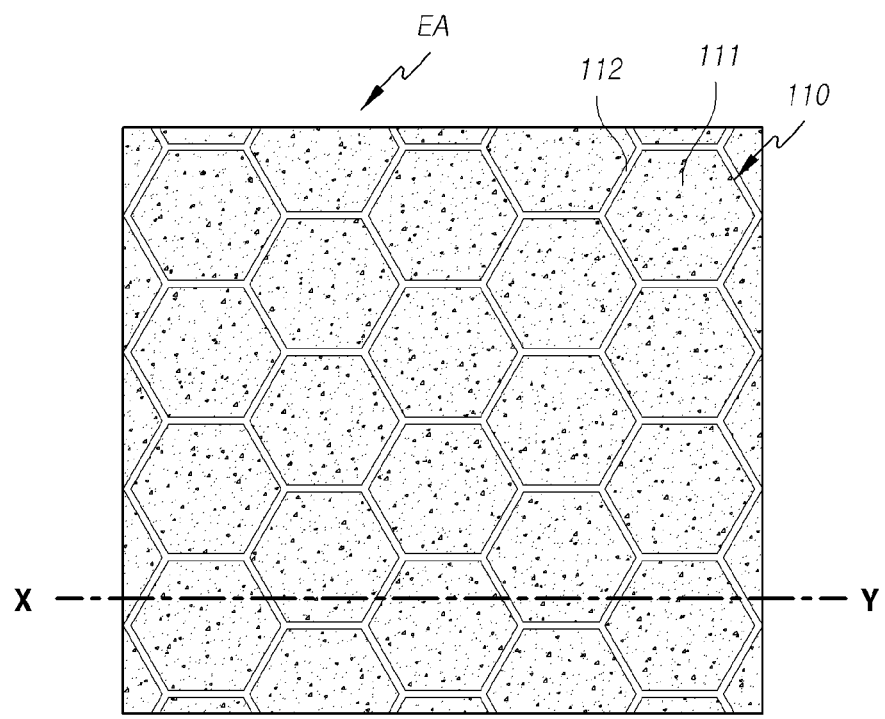
FIG. 2 is a plan view of an organic light emitting display device according to a first embodiment.

FIG. 2 is a plan view of an organic light emitting display device according to a first embodiment.

Referring to FIG. 2, an emission area EA of one sub-pixel is illustrated. Herein, the emission area EA may be an emission area EA which emits light of any color, such as red R, green G, blue G, or white W, but is not limited thereto. Meanwhile, in the organic light emitting display device according to the first embodiment, one pixel may be configured with two or four sub-pixels. The configurations illustrated in FIG. 2 may be applied to at least one sub-pixel of one pixel.

In the emission area EA, a plurality of micro lenses are disposed. The micro lenses may improve external light extraction efficiency. The plurality of micro lenses may be configured by convex portions 111 of an overcoat layer 110 and connection portions 112 connecting the convex portions 111 which are adjacent to each other. Meanwhile, FIG. 2 illustrates a configuration in which the micro lens has a hexagonal shape in a plan view, but the shape of the micro lens is not limited thereto. For example, a circular or oval shape can be applied to the micro lens according to an embodiment of the present disclosure.

On the overcoat layer 110 with the plurality of micro lenses, an organic emission element including a first electrode, an organic emission layer, and a second electrode may be disposed. Herein, the first electrode of the organic emission element may have a morphology following the shape of the plurality of micro lenses. In addition, at least one layer of the organic emission layer may be flatly formed. Such a configuration will be described below in detail with reference to FIG. 3.

Figure 3:
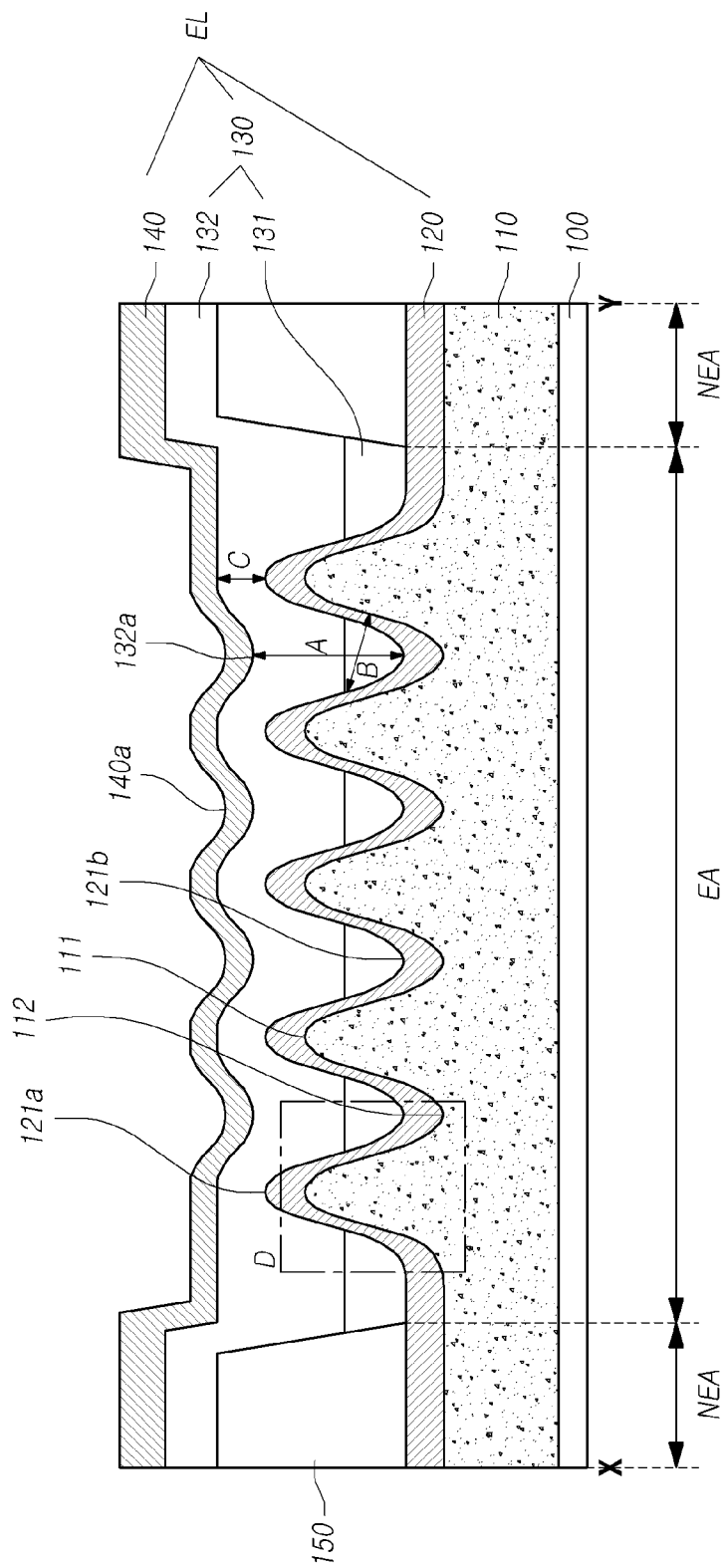
FIG. 3 is a cross-sectional view of the organic light emitting display device according to the first embodiment taken along line X-Y.

FIG. 3 is a cross-sectional view of the organic light emitting display device according to the first embodiment taken along line X-Y.

Referring to FIG. 3, the overcoat layer 110 is disposed on a first substrate 100. The overcoat layer 110 includes a plurality of micro lenses in an area corresponding to the emission area EA. The micro lenses include the plurality of convex portions 111 and the connection portions 112.

Figure 4:
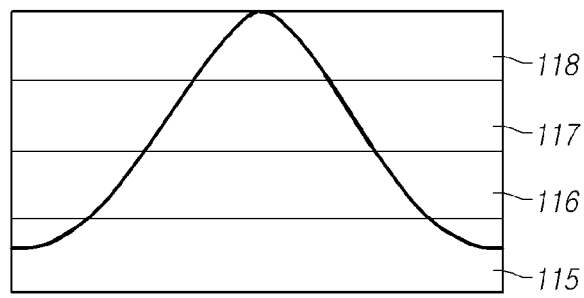
FIG. 4 is an enlarged cross-sectional view for region D of FIG. 3.

The shape of the micro lens will be described below in detail with reference to FIG. 4. FIG. 4 is an enlarged cross-sectional view for region D in FIG. 3.

Referring to FIG. 4, the convex portion 111 of the micro lens may be divided into a first region 115, a second region 116, a third region 117, and a fourth region 118. Particularly, the first region 115 of the convex portion 111 corresponds to a concave region of the micro lens, the second region 116 corresponds to a first inclined surface of the micro lens, the third region 117 corresponds to a second inclined surface extended from the first inclined surface, and the fourth region 118 corresponds to a convex region of the micro lens. Herein, an absolute value of a slope of the first inclined surface may be smaller than that of the second inclined surface. That is, an absolute value of the slope of the inclined surface of the convex portion 111 may increase toward the fourth region 118 from the first region 115.

Figure 5:
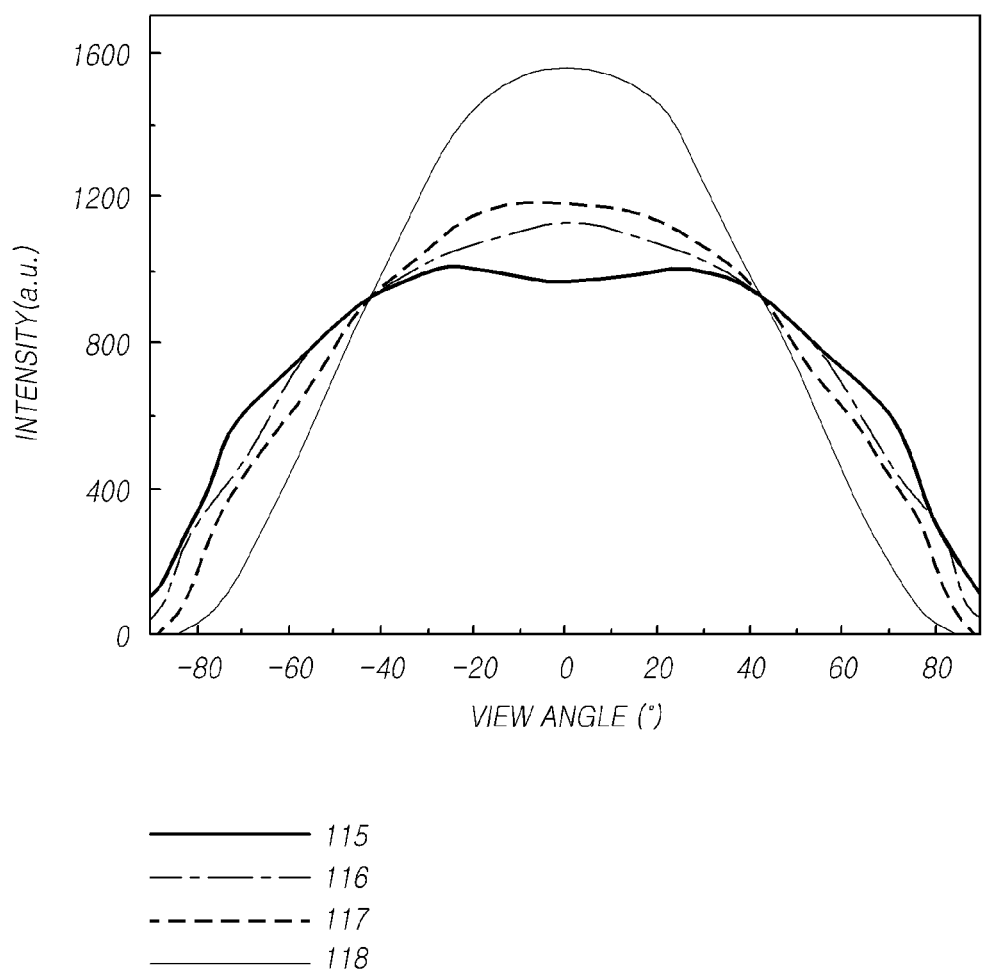
FIG. 5 is a graph illustrating a state in which light extraction efficiency in a front direction is different for each region of a convex portion.

Light extraction efficiencies may be different from each other depending on specific regions of the convex portion 111 of the micro lens. This will be described below with reference to FIG. 5. FIG. 5 is a graph illustrating a state in which light extraction efficiency in a front direction is different for each region of the convex portion 111.

Referring to FIG. 5, it can be seen that in a region corresponding to the first region 115 of the micro lens, the light extraction efficiency in a front direction (0° of a view angle) is lowest, and in a region corresponding to the fourth region 118, the light extraction efficiency in the front direction is highest. Particularly, the light extraction efficiency in the front direction may increase in the order of the first region 115, the second region 116, the third region 117, and the fourth region 118. Further, FIG. 5 shows that the light extraction efficiency in the front direction is significant in the fourth region 118.

Meanwhile, in FIG. 3, the first electrode 120 of the organic emission element EL is disposed on the overcoat layer 110. Herein, the first electrode 120 may follow morphology of the overcoat layer 110 in the emission area EA. That is, the first electrode 120 may include a plurality of convex portions 121a and a plurality of connection portions 121b in the emission area EA. Also, a bank pattern 150, which defines the emission area EA and a non-emission area NEA of the organic light emitting display device, is disposed on the upper surface of the first electrode 120. In the emission area EA, the organic emission layer 130 is disposed on the first electrode 120.

FIG. 3 illustrates that the organic emission layer 130 is disposed only in the emission area EA, but the embodiments are not limited thereto. In some embodiments, the organic emission layer 130 may be disposed on the bank pattern 150. In the following embodiments, a configuration in which the organic emission layer 130 is disposed on the emission area EA will be described by way of example.

The organic emission layer 130 of the organic emission element EL may be constituted by multiple layers. In this case, at least one layer of the organic emission layer 130 may be flatly formed. That is, at least one layer of the organic emission layer 130 may not follow the morphology of the overcoat layer 110 and the first electrode 120.

For example, as illustrated in FIG. 3, a lower organic layer 131 disposed on the first electrode 120 may be flatly formed with a substantially even level. In this case, the lower organic layer 131 may be a hole injection layer, but the embodiment is not limited thereto. An organic layer may be disposed below the emission layer of the organic emission layer 130. For example, the lower organic layer 131 may be a hole transport layer. In this case, the hole injection layer disposed below the hole transport layer may follow a morphology of the first electrode 120.

Figure 6:
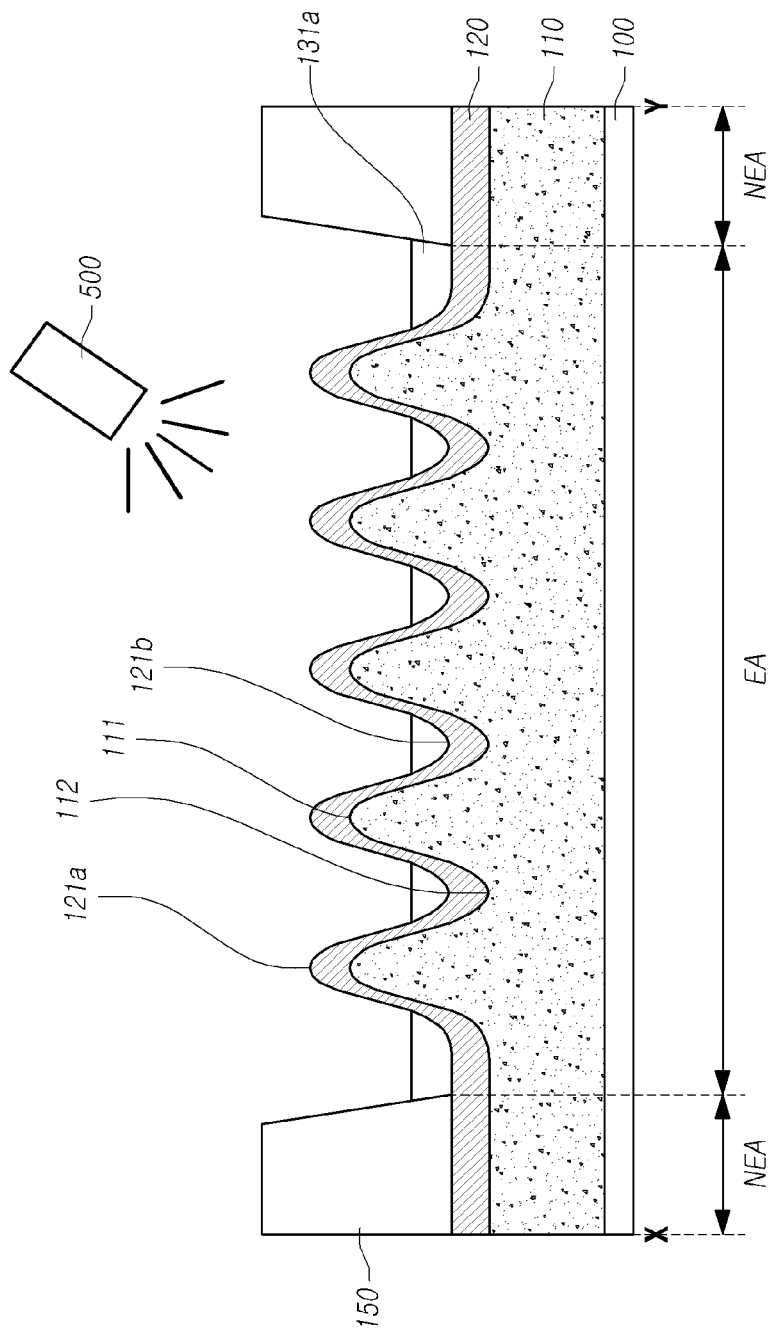
FIG. 6 is a diagram illustrating a method of forming an organic emission layer on a substrate including an overcoat layer with a micro lens.

The lower organic layer 131 may be formed by the method illustrated in FIG. 6. FIG. 6 is a diagram illustrating a method of forming an organic emission layer on a substrate including an overcoat layer with a plurality of micro lenses. The display device according to FIG. 6 may include the same constituent elements as those of the display device according to the first embodiment. Duplicated description thereof will thus be omitted. Further, like constituted elements have like reference numerals.

Referring to FIG. 6, the first electrode 120 of the organic emission layer EL is formed on the overcoat layer 110, following a morphology of a plurality of micro lenses of the overcoat layer 110.

A lower organic layer 131a may further be formed on the first electrode 120. In this case, the lower organic layer 131a may be formed by spraying or dropping a liquid organic material on the first electrode 120 through a nozzle 500 by using, for example, an inkjet printing or nozzle printing method and then by curing the liquid organic material so as to form the lower organic layer 131a on the first electrode 120 in a flat state. When the liquid organic material is sprayed or dropped on the first electrode 120, the liquid organic material flows on the first electrode 120 and accumulates at the plurality of connection portions 121b of the first electrode 120 with a flat surface. After a curing process, the liquid organic material is solidified to be the lower organic layer 131a, with the flat surface being substantially maintained. As a result, a separate planarization process may not be required on the lower organic layer 131a, which can reduce manufacturing costs.

Meanwhile, in FIG. 3, the lower organic layer 131 included in the organic emission layer 130 may be disposed to expose a part of the convex portion 121a of the first electrode 120 which is formed by the overcoat layer 110. In addition, an upper organic layer 132 is disposed on the lower organic layer 131 of the organic emission layer 130. Herein, the upper organic layer 132 may include an emission layer, an electron transport layer, and an electron injection layer. Also, the upper organic layer 132 may include at least one depressed portion 132a. In this case, the depressed portion 132a of the upper organic layer 132 may be provided in a region corresponding to the connection portion 112 of the overcoat layer 110. Herein, the low organic layer 131 is disposed to expose a part of the convex portion 121a of the first electrode 120, and thus, the upper organic layer 132 includes at least one depressed portion 132a.

As the low organic layer 131 is disposed to expose a part of the convex portion 121a of the first electrode 120, a step is generated between the first electrode 120 and the lower organic layer 131. As a result, the upper organic layer 132 disposed on the lower organic layer 131 may include at least one depressed portion 132a due to the step between the first electrode 120 and the lower organic layer 131.

A second electrode 140 disposed on the organic emission layer 130 may follow a morphology of the upper organic layer 132. That is, the second electrode 140 may include at least one depressed portion 140a.

Meanwhile, in FIG. 3, a thickness of the organic emission layer 130 in a vertical direction from the first electrode 120 may be different for each region. Herein, the thickness of the organic emission layer 130 in the vertical direction from the first electrode 120 is a factor that determines light extraction efficiency. Particularly, an electric field is concentrated and primary light emission is generated in a region where the thickness of the organic emission layer 130 in the vertical direction from the first electrode 120 is smaller than those of other regions.

In the organic light emitting display device according to the first embodiment, thickness A of the organic emission layer 130 along a vertical direction in a region corresponding to the connection portion 112 of the overcoat layer 110 may be greater than thickness B of the organic emission layer 130 along a normal direction with respect to an inclined surface of the overcoat layer 110. In addition, thickness B of the organic emission layer 130 may be greater than thickness C of the organic emission layer 130 along the vertical direction in a region corresponding to the convex portion 111 of the overcoat layer 110.

Since the lower organic layer 131 is flatly formed, the thickness of the organic emission layer 130 may be the smallest in the region corresponding to the convex portion 111 of the micro lens. That is, in the region corresponding to the fourth region (see FIG. 4) having the highest light extraction efficiency in the convex portion 111 of the micro lens, the thickness of the organic emission layer 130 may be formed to be smallest. As a result, the fourth region in the convex portion 111 of the micro lens has the highest light extraction efficiency, and the electric field is concentrated in the organic emission layer at the region corresponding to the fourth region to generate primary light emission, thereby enhancing light emission efficiency.

Figure 7:
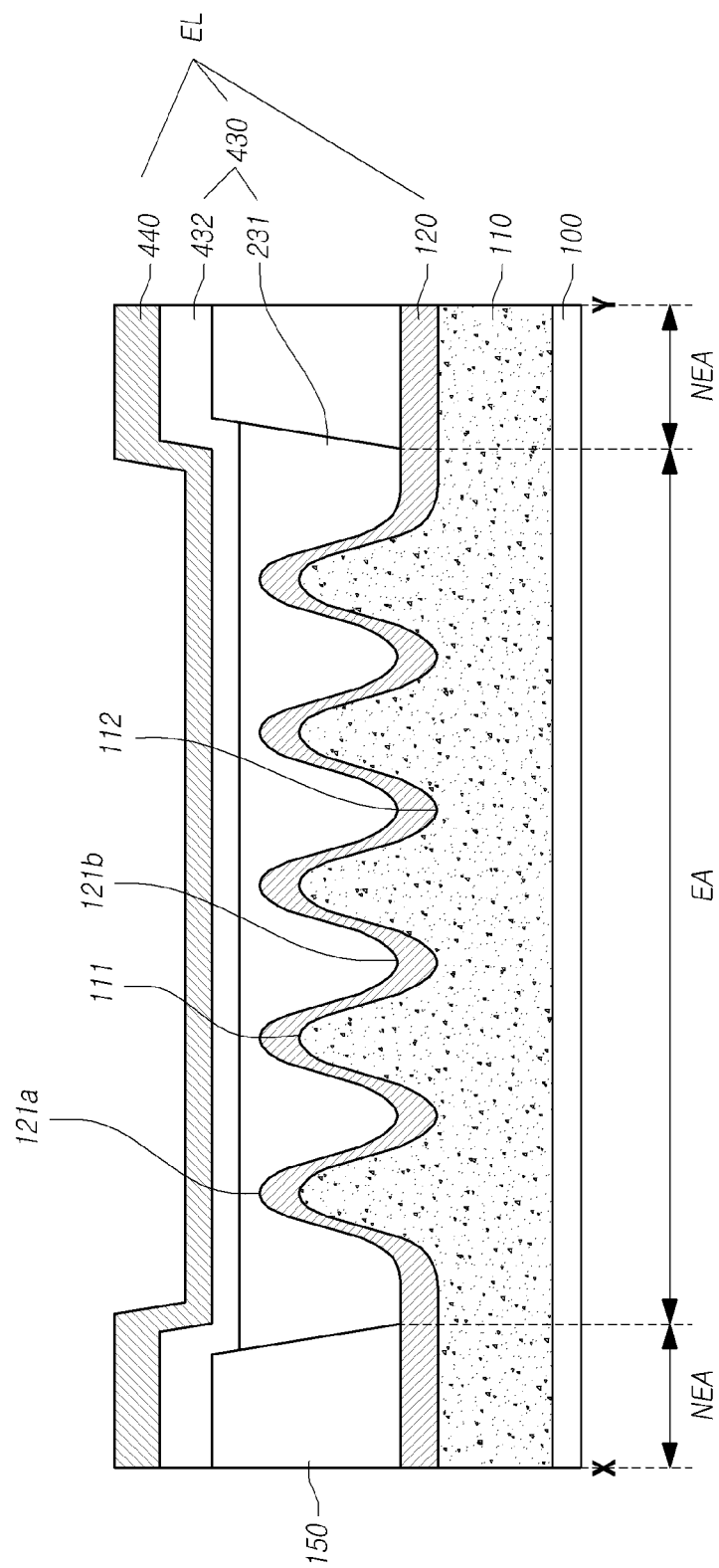
FIG. 7 is a cross-sectional view including an emission area of an organic light emitting display device according to a second embodiment.

An organic light emitting display device according to a second embodiment will be described below with reference to FIG. 7. FIG. 7 is a cross-sectional view including an emission area of an organic light emitting display device according to the second embodiment. The display device according to the second embodiment may include the same constituent elements as those of the display device according to the first embodiment. Duplicated description thereof will thus be omitted. Further, like constituted elements have like reference numerals.

Referring to FIG. 7, an organic emission layer 430 of the organic light emitting display device according to the second embodiment includes a lower organic layer 231 disposed on the first electrode 120 and an upper organic layer 432 disposed on the lower organic layer 231. Herein, the lower organic layer 231 and the upper organic layer 432 may have a flat morphology in an emission area EA including an overcoat layer 110 with a plurality of micro lenses.

Particularly, the lower organic layer 231 is formed by a method of spraying or dropping and then curing a material through a nozzle by using, for example, an inkjet printing or nozzle printing method on the first electrode 120 formed according to the morphology of the micro lenses, and thus, the lower organic layer 231 is flatly formed even on the first electrode 120. In this case, the lower organic layer 231 may be disposed even on a convex portion 121a of the first electrode 120. That is, the lower organic layer 231 may be disposed on the convex portion 121a and a connection portion 121b of the first electrode 120.

The upper organic layer 432 including an emission layer is disposed on the lower organic layer 231. Herein, the upper organic layer 432 is formed on the lower organic layer 231 which is flatly formed and thus, the upper organic layer 432 may also be flatly formed. That is, the organic emission layer 430 may have a flat morphology in the emission area EA including the micro lens.

A second electrode 440 is disposed on the upper organic layer 432. Herein, the second electrode 440 may also have a flat morphology. That is, in an organic emission element EL according to the second embodiment, in the emission area EA, the first electrode 120 may be formed according to the morphology of the overcoat layer 110, and the organic emission layer 430 and the second electrode 440 may be flatly formed.

Meanwhile, the lower organic layer 231 and the upper organic layer 432 are flatly formed and thus, the organic emission layer 430 may be formed to have a smallest thickness in a region corresponding to the convex portion 111 of the micro lens disposed on the overcoat layer 110. That is, in the region corresponding to the fourth region (see FIG. 4) having the highest light extraction efficiency in the convex portion 111 of the micro lens, the thickness of the organic emission layer 430 may be formed to be smallest. As a result, in the fourth region having the highest light extraction efficiency in the convex portion 111 of the micro lens, the electric field is concentrated in the organic emission layer to generate primary light emission, thereby enhancing light emission efficiency by applying a plurality of micro lenses.

An organic light emitting display device according to a third embodiment will be described below with reference to FIG. 8.

Figure 8:
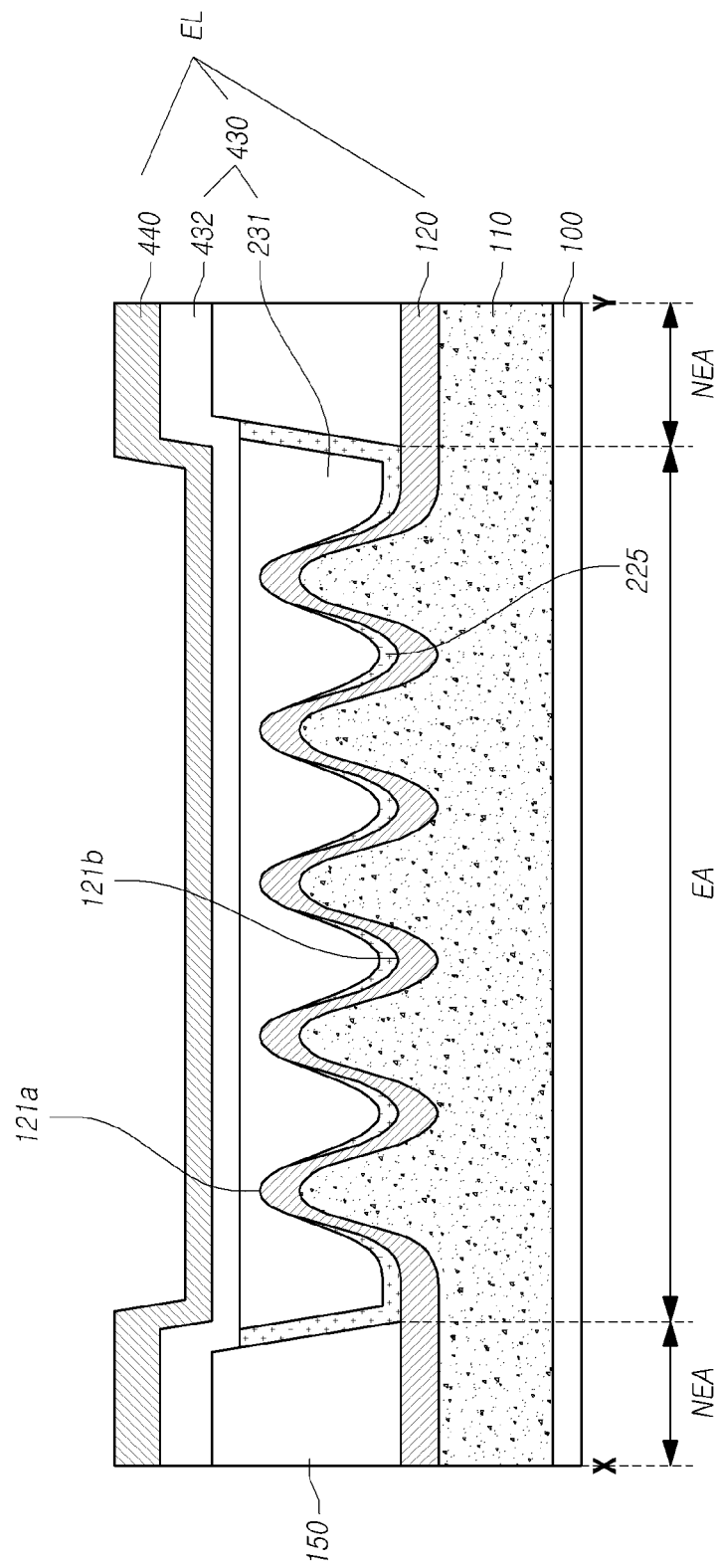
FIG. 8 is a cross-sectional view including an emission area of an organic light emitting display device according to a third embodiment.

FIG. 8 is a cross-sectional view including an emission area of an organic light emitting display device according to a third embodiment. The display device according to the third embodiment may include the same constituent elements as those of the display device according to the aforementioned embodiments. Duplicated description thereof will thus be omitted. Further, like constituted elements have like reference numerals.

Referring to FIG. 8, the organic light emitting display device according to the third embodiment further includes a reflective layer 225 between the first electrode 120 and the organic emission layer 430 as compared with the organic light emitting display device according to the second embodiment. Particularly, the reflective layer 225 may be disposed between the first electrode 120 and the lower organic layer 231.

Herein, the reflective layer 225 may be disposed on the first electrode 120 in regions corresponding to the first region to the third region (see FIG. 4) of the convex portion 111 of the micro lens. That is, the reflective layer 225 may not be disposed in the region corresponding to the fourth region (see FIG. 4) of the convex portion 111 of the micro lens. However, the reflective layer 225 according to the third embodiment is not limited thereto, and the reflective layer 225 may be, for example, disposed on the first electrode 120 only in regions corresponding to the first and second regions (see FIG. 4) of the convex portion 111 of the micro lens. That is, the reflective layer 225 may not be disposed in the third and fourth regions (see FIG. 4) of the convex portion 111 of the micro lens.

When the reflective layer 225 is not disposed in the third and fourth regions or the fourth region (see FIG. 4) of the convex portion 111 of the micro lens having a high light extraction efficiency, and thus in the third and fourth regions or the fourth region (see FIG. 4), most of the light emitted from the organic emission element EL in a front direction may be extracted to the outside of the first substrate 100.

Particularly, a part of the light that is emitted from the organic emission element EL and has a propagation direction toward a second electrode 440 is reflected by the second electrode 440, and the propagation direction is then shifted toward the first substrate 100, and a remaining light is emitted toward the first electrode 120. In this case, the light reflected by the second electrode 440 and the part of the light emitted toward the first electrode 120 direction are emitted outside the display device by passing through the first electrode 120 and the overcoat layer 110 in the region corresponding to the third and fourth regions or the fourth region (see FIG. 4) of the convex portion 111 of the micro lens.

Further, the light reflected by the second electrode 440 and the remaining part of the light emitted toward the first electrode 120 are reflected by the reflective layer 225 disposed in the region corresponding to the first to third regions or the first and second regions (see FIG. 4) of the convex portion 111 of the micro lens, and thus, the propagation direction toward the second electrode 440 is shifted again. The light of which the propagation direction toward the second electrode 440 is shifted is again reflected by the second electrode 440 to be emitted outside the display device by passing through the first electrode 120 and the overcoat layer 110 in the region corresponding to the third and fourth regions or the fourth region (see FIG. 4) of the convex portion 111 of the micro lens.

As a result, the reflective layer 225 may increase an amount of light emitted outside the display device through the micro lens, and reduce an amount of light which is trapped inside the display device.

An organic light emitting display device according to a fourth embodiment will be described below with reference to FIG. 9.

Figure 9:
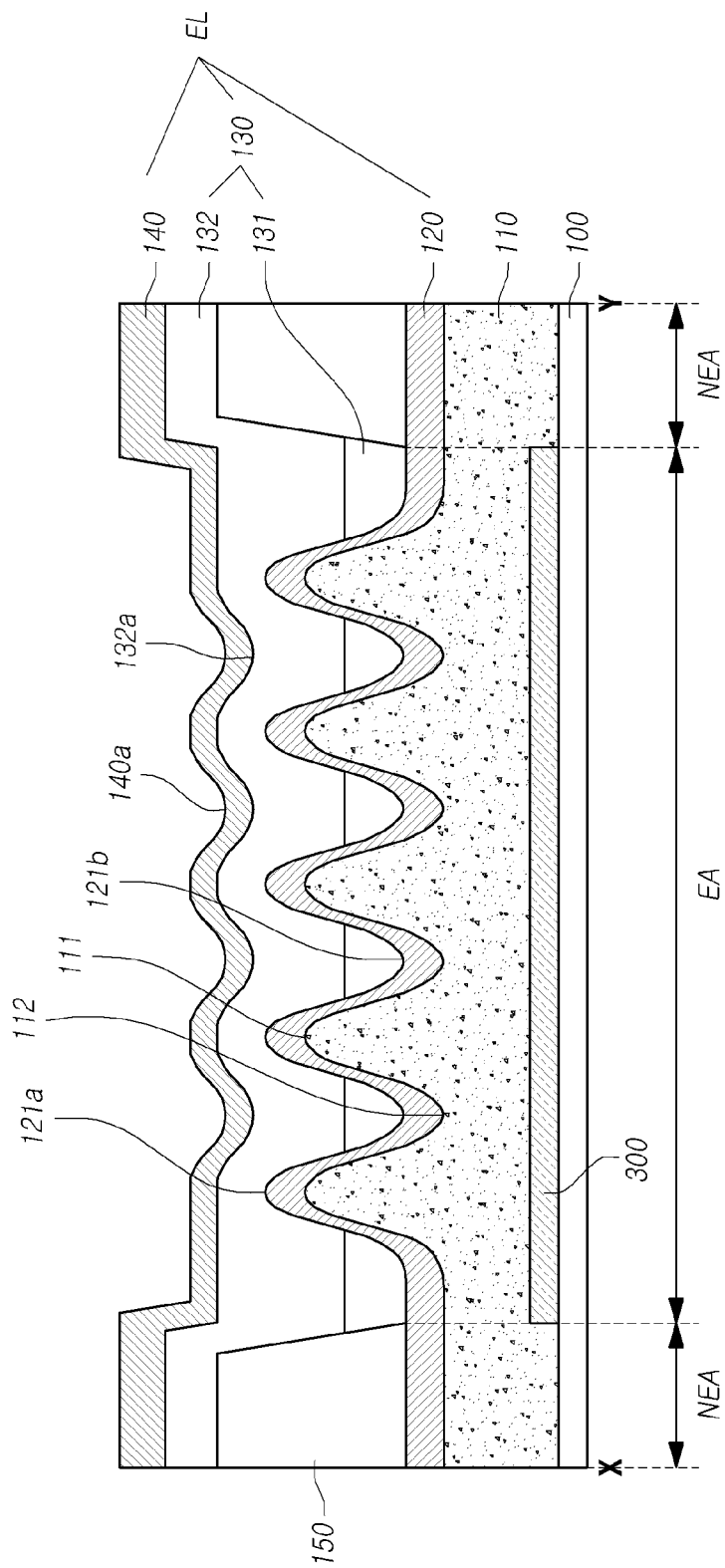
FIG. 9 is a cross-sectional view including an emission area of an organic light emitting display device according to a fourth embodiment.

FIG. 9 is a cross-sectional view including an emission area of an organic light emitting display device according to a fourth embodiment. The display device according to the fourth embodiment may include the same constituent elements as those of the display devices according to the previous embodiments. Duplicated description thereof will thus be omitted. Further, like constituted elements have like reference numerals.

Referring to FIG. 9, the organic light emitting display device according to the fourth embodiment may include a color filter layer 300 between the first substrate 100 and the overcoat layer 110. In this case, the color filter layer 300 may be disposed in a region corresponding to the emission area EA. Herein, the organic light emitting display device according to the fourth embodiment may be a bottom-emission type organic light emitting display device.

The light emitted from the organic emission element EL is converted into a color corresponding to each sub-pixel to be emitted to the outside of the display device. FIG. 9 illustrates one emission area, but the organic light emitting display device according to the fourth embodiment is not limited thereto. For example, a plurality of sub-pixels may selectively include a color filter layer 300.

As described above, an organic light emitting display device having a plurality of micro lenses according to an embodiment includes an organic emission layer in which at least one layer is formed in an emission area with a substantially even level, and thus the electric field is concentrated in the organic emission layer in a region having a high light extraction efficiency to generate primary light emission, thereby enhancing light extraction efficiency.

Features, structures, effects, and the like described in the aforementioned exemplary embodiments are included in at least one exemplary embodiment of the present disclosure and is not particularly limited to only one exemplary embodiment. Furthermore, the feature, the structure, the effect, and the like exemplified in each exemplary embodiment are combined or modified to be executed even with respect to other exemplary embodiments by those skilled in the art to which the exemplary embodiments pertain. Therefore, it should be construed that contents associated with the combination and modification are included in the scope of the present disclosure.

Further, in the above description, the present disclosure has been described based on the exemplary embodiments, but the exemplary embodiments are for illustrative, and do not limit the present disclosure, and those skilled in the art will appreciate that various modifications and applications, which are not exemplified in the above description, may be made without departing from the scope of the essential characteristic of the present exemplary embodiments. For example, each component described in detail in the exemplary embodiment can be modified and executed.

What is claimed is:

1. A method for manufacturing an organic light emitting display device, comprising:

forming an overcoat layer with a plurality of micro lenses in an emission area on a substrate, the substrate being divided into the emission area and a non-emission area;

forming a first electrode on the overcoat layer in the emission area;

forming an organic stacking layer on the first electrode in the emission area, the organic stacking layer including an organic emission layer, at least one surface of the organic stacking layer having a flat surface in the emission area;

forming a reflective layer disposed between the organic emission layer and the first electrode in the emission area; and forming a second electrode on the organic stacking layer in the emission area and the non-emission area, wherein a micro lens from the plurality of micro lenses is divided into a first region, a second region, a third region, and a fourth region, the first region corresponds to a concave region of the micro lens, the second region corresponds to a first inclined surface of the micro lens, the first inclined surface extended from the concave region, the third region corresponds to a second inclined surface extended from the first inclined surface, and the fourth region corresponds to a convex region of the micro lens, and wherein the reflective layer is formed only in the first to third regions or the first and second regions of the micro lens.

2. The method for manufacturing the organic light emitting display device of claim 1, wherein the organic stacking layer is divided into a lower organic stacking layer disposed on the first electrode and an upper organic stacking layer disposed on the lower organic stacking layer, the organic emission layer is in upper organic stacking layer, and the lower organic stacking layer or the upper organic stacking layer is formed by an inkjet printing method or a nozzle printing method.

3. The method for manufacturing the organic light emitting display device of claim 1, wherein each of the plurality of micro lenses including a convex region, a thickness in a vertical direction of the organic stacking layer is smallest in a region corresponding to the convex region of each of the plurality of micro lenses.

4. The method for manufacturing the organic light emitting display device of claim 1, wherein an absolute value of a slope of the first inclined surface is smaller than an absolute value of a slope of the second inclined surface.

5. The method for manufacturing the organic light emitting display device of claim 1, wherein a morphology of the first electrode is corresponding to a morphology of the plurality of micro lenses in the emission area.

6. The method for manufacturing the organic light emitting display device of claim 5, wherein the first electrode comprises a convex portion and a connection portion.

7. The method for manufacturing the organic light emitting display device of claim 2, wherein the upper organic stacking layer includes the organic emission layer.

8. The method for manufacturing the organic light emitting display device of claim 2, wherein each of the plurality of micro lenses further includes a concave region connected to the convex region, and the lower organic stacking layer is disposed at a concave region of the micro lens.

9. The method for manufacturing the organic light emitting display device of claim 8, wherein a morphology of the first electrode is corresponding to a morphology of the plurality of micro lenses in the emission area.

10. The method for manufacturing the organic light emitting display device of claim 9, wherein the first electrode comprises a convex portion and a connection portion.

11. The method for manufacturing the organic light emitting display device of claim 1, wherein a color filter layer is further formed between the substrate and the overcoat layer in the emission area.

* * * * *